(12) United States Patent
Suzuki et al.

(10) Patent No.: US 7,557,414 B2
(45) Date of Patent: Jul. 7, 2009

(54) SEMICONDUCTOR DEVICE AND METHOD FOR MANUFACTURING THE SAME

(75) Inventors: Ken Suzuki, Osaka (JP); Masafumi Tsutsui, Shiga (JP)

(73) Assignee: Panasonic Corporation, Osaka (JP)

( * ) Notice: Subject to any disclaimer, the term of this patent is extended or adjusted under 35 U.S.C. 154(b) by 364 days.

(21) Appl. No.: 11/455,649

(22) Filed: Jun. 20, 2006

(65) Prior Publication Data

US 2007/0090465 A1 Apr. 26, 2007

(30) Foreign Application Priority Data

Oct. 25, 2005 (JP) ............................. 2005-310244

(51) Int. Cl.
*H01L 29/94* (2006.01)
(52) U.S. Cl. .................... 257/369; 257/355; 257/329; 257/135; 257/E21.371; 257/E21.387; 257/E21.441; 257/E21.452; 257/E21.403; 257/E21.407; 257/E21.445
(58) Field of Classification Search .............. 257/355, 257/356, E21.371, 369, E21.387, E21.441, 257/E21.452, E21.403, E21.407, E21.445
See application file for complete search history.

(56) References Cited

U.S. PATENT DOCUMENTS

| 2005/0145897 A1* | 7/2005 | Matsuo et al. ............... 257/288 |
| 2005/0269640 A1* | 12/2005 | Shimamoto et al. ......... 257/351 |
| 2006/0249794 A1* | 11/2006 | Teh et al. ..................... 257/369 |

FOREIGN PATENT DOCUMENTS

JP 2002-198368 7/2002

* cited by examiner

*Primary Examiner*—Wai-Sing Louie
*Assistant Examiner*—Marc Armand
(74) *Attorney, Agent, or Firm*—McDermott Will & Emery LLP

(57) ABSTRACT

In a semiconductor device having a first MIS transistor on a semiconductor substrate, the first MIS transistor includes a p-type semiconductor layer, a first gate insulating film, a first gate electrode, a first sidewall insulating film including at least a first sidewall, an n-type extension diffusion layer, and an n-type impurity diffusion layer. The first sidewall is not formed at the side faces of the first gate electrode on the p-type semiconductor layer. An insulating film having tensile stress is formed on the semiconductor substrate so as to cover the first MIS transistor.

15 Claims, 10 Drawing Sheets

SEMICONDUCTOR DEVICE AND METHOD FOR MANUFACTURING THE SAME

CROSS REFERENCE TO RELATED APPLICATIONS

This Non-provisional application claims priority under 35 U.S.C. § 119(a) on Patent Application No. 2005-310244 filed in Japan on Oct. 25, 2005, the entire contents of which are hereby incorporated by reference.

BACKGROUND ART

The present invention relates to a semiconductor device and a method for manufacturing it, and specifically relates to a semiconductor device that exerts high drivability by appropriately adjusting the conductivity of a carrier in a channel region of an MIS (Metal Insulator Semiconductor) transistor.

In various methods for increasing drivability of an MIS transistor, there is a method of increasing a drain current as a drive current. Of several measures of determining the drain current, carrier mobility is listed.

In general, it is known that the carrier mobility can be changed in such a manner that scattering rate or an effective mass of the carrier is changed by changing the lattice constant of atoms composing a semiconductor substrate.

Under the circumstances, a technique has been proposed in which the mobility of the carrier passing through the lattices is changed in such a manner that a film having tensile stress is disposed on an MIS transistor to increase the lattice constant of silicon atoms in a channel region of the transistor.

A conventional semiconductor device which focuses attention on the carrier mobility in the channel region will be described below with reference to FIG. 12. FIG. 12 is a section of a structure of a main part of the conventional semiconductor device.

As shown in FIG. 12, an NMOS (N-type channel Metal Oxide Semiconductor) region 503 defined by an element isolation 502 and including a p-type well is formed in a semiconductor substrate 501 made of, for example, silicon. A gate insulating film 511 and a gate electrode 512 are formed in the upward order on the NMOS region 503. Further, n-type source/drain diffusion regions 517 serving as impurity diffusion layers to which an n-type impurity ion such as arsenic is implanted are formed in the NMOS region 503. Each n-type source/drain diffusion layer 517 includes an n-type extension diffusion layer 516 which is formed in a region below each side face of the gate electrode 512 and of which junction depth is comparatively shallow. Sidewalls 513 made of SiN are formed at the side faces of the gate insulating film 51 and the gate electrode 512. A silicide layer 514 is formed on the gate electrode 511 and the n-type source/drain diffusion layers 517. Over the entirety of the semiconductor substrate 501, a liner film 530 made of a silicon nitride film having tensile stress and formed by LP-CVD is formed so as to cover the element isolation 502, the gate electrode 512, the sidewall 513, and the silicide layer 514 (see, for example, Japanese Patent Application Laid Open Publication No. 2002-198368A). Herein, the silicon nitride film having tensile stress means a silicon nitride film which exerts tensile stress on a channel region in the direction of the gate length.

In the conventional semiconductor device shown in FIG. 12, the tensile stress that the liner film 530 has increases the lattice constant of the silicon atoms composing the channel region of the semiconductor substrate 501.

However, the sidewall 513 formed on each side face of the gate insulating film 511 and the gate electrode 512 inhibits the tensile stress that the liner film 530 has from being transmitted effectively to the channel region of the semiconductor substrate 501, attaining an insufficient increase in lattice constant of the silicon atoms in the channel region of the semiconductor substrate 501. As a result, the carrier mobility increases insufficiently.

SUMMARY OF THE INVENTION

Each mobility of holes and electrons as carriers increases or decreases according to a direction of the tensile stress applied to the channel region. For example, when the channel direction is set along a crystal orientation of <110> and the tensile stress is applied in the channel direction, the electron mobility increases while the hole mobility decreases. In contrast, when the channel direction is set along a crystal orientation of <100> and the tensile stress is applied in the channel direction, the electron mobility increases while the hole mobility decreases less. For this reason, the direction of the tensile stress to be applied must be set appropriately. Particularly, the direction of the tensile stress to be applied is a key in the case where both an NMOS region and a PMOS region are provided on the same semiconductor substrate.

In view of the foregoing, the present invention has its object of increasing carrier mobility in a channel region of an NMIS region.

For attaining the above object, a first aspect of the present invention provides a semiconductor device, including a semiconductor substrate, an element isolation, a first MIS transistor on the semiconductor substrate, and an insulating film which has tensile stress and which is formed on the semiconductor substrate so as to cover the first MIS transistor, wherein the first MIS transistor includes: a p-type semiconductor layer defined by the element isolation in the semiconductor substrate; a first gate insulating film formed on the p-type semiconductor layer; a first gate electrode formed on the first gate insulating film and the element isolation so as to lie astride the p-type semiconductor layer; a first sidewall insulating film formed at each side face of the first gate electrode on the element isolation and including at least a first sidewall; an n-type extension diffusion layer formed outwards from the first gate electrode in the p-type semiconductor layer; and an n-type impurity diffusion layer formed in a region of the p-type semiconductor layer which is adjacent to the n-type extension diffusion layer, and the first sidewall is not formed at each side face of the first gate electrode on the p-type semiconductor layer.

In the semiconductor device according to the first aspect of the present invention, the first sidewalls formed at the side faces of the gate electrode are removed on the p-type semiconductor layer, so that the tensile stress that the insulating film has is applied efficiently to the channel region of the p-type semiconductor layer. Thus, the tensile stress can be increased in the channel region of the p-type semiconductor layer. As a result, the electron mobility in the channel region of the p-type semiconductor layer increases and the transistor power also increases.

The semiconductor device according to the first aspect of the present invention further includes a second MIS transistor, wherein the second MIS transistor includes: an n-type semiconductor layer defined by the element isolation in the semiconductor substrate; a second gate insulating film formed on the n-type semiconductor layer; a second gate electrode formed on the second gate insulating film; a second sidewall insulating film formed at each side face of the second gate electrode and including at least a second sidewall; a p-type extension diffusion layer formed outwards from the second gate electrode in the n-type semiconductor layer; and a p-type impurity diffusion layer formed in a region of the n-type semiconductor layer which is adjacent to the p-type extension diffusion layer, and the insulating film having tensile stress further covers the second MIS transistor.

With the above arrangement in which the n-type transistor and the p-type transistor are formed on the same semiconductor substrate, the electron mobility can be increased in the channel region of the p-type transistor while the hole mobility can be decreased in the channel region of the n-type transistor.

In the semiconductor device according to the first aspect of the present invention, the first sidewall insulating film may not be formed at each side face of the first gate electrode on the p-type semiconductor layer.

In the semiconductor device according to the first aspect of the present invention, it is preferable that the first sidewall insulating film further includes an L-shaped insulating film in an L shape in section which extends between the first sidewall and each side face of the first gate electrode and between the first sidewall and the element isolation and the L-shaped insulating film extends to each side face of the first gate electrode on the p-type semiconductor layer.

With the above arrangement, a region where the insulating film having the tensile stress and the semiconductor substrate are in direct contact with each other is reduced, thereby suppressing formation of an interface state which would involve an adverse influence on the characteristic of the transistor.

In this case, the L-shaped insulating film may include: a first insulating film in an I shape in section which is formed at each side face of the first gate electrode; and a second insulating film in an L shape in section which is formed at a side face of the first insulating film.

A semiconductor device according to a second aspect of the present invention includes a semiconductor substrate, an element isolation, a first MIS transistor and a second MIS transistor, the first MIS transistor and the second MIS transistor being formed in the semiconductor substrate, and an insulating film having tensile stress which is formed on the semiconductor substrate so as to cover the first MIS transistor and the second MIS transistor, wherein the first MIS transistor includes: a p-type semiconductor layer defined by the element isolation in the semiconductor substrate; a first gate insulating film formed on the p-type semiconductor layer; a first gate electrode formed on the first gate insulating film; an n-type extension diffusion layer formed outwards from the first gate electrode in the p-type semiconductor layer; and an n-type impurity diffusion layer formed in a region of the p-type semiconductor layer which is adjacent to the n-type extension diffusion layer, the second MIS transistor includes: an n-type semiconductor layer defined by the element isolation in the semiconductor substrate; a gate insulating film formed on the n-type semiconductor layer; a second gate electrode formed on the second gate insulating film; a sidewall insulating film formed at each side face of the second gate electrode and including at least a sidewall; a p-type extension diffusion layer formed outwards from the second gate electrode in the n-type semiconductor layer; and a p-type impurity diffusion layer formed in a region of the n-type semiconductor layer which is adjacent to the n-type extension diffusion layer, and no sidewall is formed at each side face of the first gate electrode.

In the semiconductor device according to the second aspect of the present invention in which the n-type transistor and the p-type transistor are formed on the same semiconductor substrate, no sidewalls are formed at the side faces of the gate electrode of the n-type transistor. Accordingly, the tensile stress that the insulating film has is applied efficiently to the channel region of the n-type transistor, increasing the tensile stress in the channel region. This increases the electron mobility in the channel region of the n-type transistor to increase the transistor power. On the other hand, the sidewalls are not formed at the side faces of the gate electrode of the p-type transistor, which has no need to increase the drivability, so that the tensile stress does not increase in the channel region of the p-type transistor.

In the semiconductor device according to the second aspect of the present invention, the first sidewall insulating films may not be formed at the side faces of the first gate electrode on the p-type semiconductor layer.

In the semiconductor device according to the second aspect of the present invention, no sidewall insulating film may be formed at each side face of the first gate electrode.

In the semiconductor device according to the second aspect of the present invention, it is preferable that the sidewall insulating film further includes an L-shaped insulating film in an L shape in section which extends between the sidewall and each side face of the second gate electrode and between the sidewall and the n-type semiconductor layer and another L-shaped insulating film is formed at each side face of the first gate electrode.

With the above arrangement, a region where the insulating film having the tensile stress and the semiconductor substrate are in direct contact with each other is reduced, thereby suppressing formation of an interface state which would involve an adverse influence on the characteristic of the transistors.

In this case, the L-shaped insulating films included in the sidewall insulating film may include a first insulating film in an I shape in section which is formed at each side face of the first gate electrode and a second insulating film in an L shape in section which is formed at the side face of the first insulating film.

A first aspect of the present invention provides a semiconductor device manufacturing method which includes the steps of: (a) forming a p-type semiconductor layer so as to be defined by an element isolation in a semiconductor substrate; (b) forming a gate insulating film on the p-type semiconductor layer and forming a gate electrode on the gate insulating film and the element isolation so as to lie astride the p-type semiconductor layer; (c) forming an n-type extension diffusion layer in a region of the p-type semiconductor layer which is located below each side of the gate electrode; (d) forming, after the step (c), a sidewall insulating film including at least a sidewall at each side face of the gate electrode; (e) forming an n-type impurity diffusion layer in a region of the p-type semiconductor layer which is located below a side of the sidewall insulating film so as to be adjacent to the n-type extension diffusion layer; (f) selectively removing, after the step (e), a part of the sidewall which is located on the p-type semiconductor layer; and (g) forming, after the step (f), an insulating film having tensile stress over the entirety of the semiconductor substrate, wherein the sidewall insulating film including the sidewall is formed between each side face of the gate electrode on the element isolation and the insulating film.

In the semiconductor device manufacturing method according to the first aspect of the present invention, the sidewall insulating films formed at the side faces of the gate electrode on the p-type semiconductor layer are removed. Hence, the tensile stress that the insulating film has is efficiently applied to the channel region of the p-type semiconductor layer, increasing the tensile stress in the channel region of the p-type semiconductor layer. As a result, the electron mobility in the channel region of the p-type semiconductor layer increases, and the transistor power increases. Further, the element isolation can be covered with the resist pattern when the sidewalls on the p-type semiconductor layer is removed, thereby preventing the element isolation from damage by etching. An interface state, which causes degradation of the transistor performance, is formed in such a manner that the element isolation is damaged by etching to allow the p-type semiconductor layer to expose to the air. However, in this method, formation of the interface state is prevented with no damage by etching, suppressing the degradation of the transistor performance.

In the semiconductor device manufacturing method according to the first aspect of the present invention, it is preferable that the sidewall insulating film further includes an L-shaped insulating film at each side face of the gate electrode and the sidewall is formed on a side face and the bottom face of the L-shaped insulating film.

This arrangement reduces a region where the insulating film having the tensile stress and the semiconductor substrate are in direct contact with each other, suppressing formation of an interface state which would involve an adverse influence on the characteristic of the transistor.

In the semiconductor device manufacturing method according to the first aspect of the present invention, in the step (f), a part of the sidewall insulating film which is located on the p-type semiconductor layer is removed.

A semiconductor device manufacturing method according to a second aspect of the present invention includes the steps of: (a) forming a p-type semiconductor layer and an n-type semiconductor layer so as to be defined by an element isolation in a semiconductor substrate; (b) forming a first gate electrode on the p-type semiconductor layer with a first gate insulating film interposed; (c) forming a second gate electrode on the n-type semiconductor layer with a second gate insulating film interposed; (d) forming an n-type extension diffusion layer in a region of the p-type semiconductor layer which is located below each side of the first gate electrode; (e) forming a p-type extension diffusion layer in a region of the n-type semiconductor layer which is located below each side of the second gate electrode; (f) forming, after the step (d) and the step (e), a first sidewall insulating film including at least a first sidewall at each side face of the first gate electrode and forming a second sidewall insulating film including at least a second sidewall at each side face of the second gate electrode; (g) forming an n-type impurity diffusion layer in a region of the p-type semiconductor layer which is located below a side of the first sidewall insulating film so as to be adjacent to the n-type extension diffusion layer; (h) forming a p-type impurity diffusion layer in a region of the n-type semiconductor layer which is located below a side of the second sidewall insulating film so as to be adjacent to the p-type extension diffusion layer; (i) removing, after the step (g) and the step (h), at least a part of the first sidewall which is located on the p-type semiconductor layer; and (j) forming, after the step (i), an insulating film having tensile stress over the entirety of the semiconductor substrate, wherein the second sidewall insulating film is formed between each side face of the second gate electrode and the insulating film.

In the semiconductor device manufacturing method according to the second aspect of the present invention, where the n-type transistor and the p-type transistor are formed on the same semiconductor substrate, the sidewalls at the side faces of the gate electrode of the n-type transistor are removed. Accordingly, the tensile stress that the insulating film has is applied efficiently to the channel region of the n-type transistor, increasing the tensile stress in the channel region of the n-type transistor. This increases the electron mobility in the channel region of the n-type transistor to increase the transistor power. On the other hand, the sidewalls are not removed on the side faces of the gate electrode of the p-type transistor, which has no need to increase the drivability, so that the tensile stress in the channel region of the p-type transistor does not increase.

In the semiconductor device manufacturing method according to the second aspect of the present invention, it is preferable that the first sidewall insulating film further includes an L-shaped insulating film formed at each side face of the first gate electrode, and the first sidewall is formed on a side face and the bottom face of the L-shaped insulating film.

The above arrangement reduces a region where the insulating film having the tensile stress and the semiconductor substrate are in direct contact with each other, suppressing formation of an interface state which would involve an adverse influence on the characteristic of the transistors.

In this case, at least a part of the first sidewall insulating film which is formed on the p-type semiconductor layer is removed in the step (i).

As described above, in the semiconductor device and the manufacturing method thereof according to one aspect of the present invention, the tensile stress in the channel region of the p-type semiconductor layer is increased to increase the electron mobility in the channel region of the p-type semiconductor layer. As a result, the transistor power increases.

Further, in the case where the n-type transistor and the p-type transistor are formed on the same semiconductor substrate, the electron mobility can be increased in the channel region of the n-type transistor while the hole mobility can be decreased in the channel region of the p-type transistor.

BRIEF DESCRIPTION OF THE DRAWINGS

FIG. 2A and FIG. 2B are sections showing the main part of the semiconductor device according to Embodiment 1 of the present invention, wherein FIG. 2A is a section taken along the line IIa-IIa in FIG. 1 and FIG. 2B is a section taken along the line IIb-IIb in FIG. 1.

DESCRIPTION OF THE PREFERRED EMBODIMENTS

Each embodiment of the present invention will be descried with reference to the accompanying drawings.

Embodiment 1

A semiconductor device and a method for manufacturing it according to Embodiment 1 of the present invention will be described below with reference to the drawings. Wherein, tensile stress in the following description means stress to be applied in a direction of the gate length of a transistor in a channel region. Also, the channel direction is set along a crystal orientation of <110> as an example.

The semiconductor device according to Embodiment 1 of the present invention will be described below.

Figure 1:
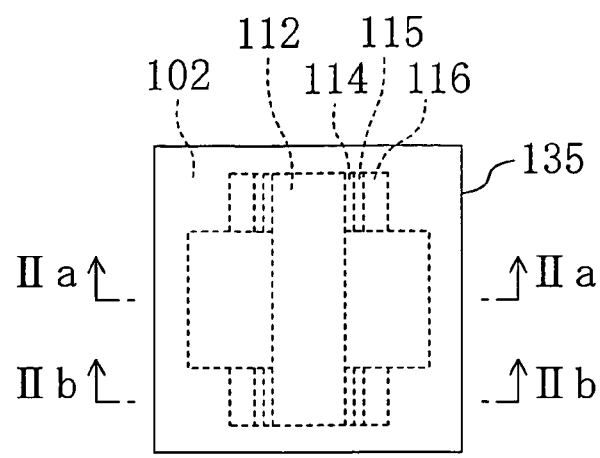
FIG. 1 is a plan view showing a main part of a semiconductor device according to Embodiment 1 of the present invention.
Figure 2A:
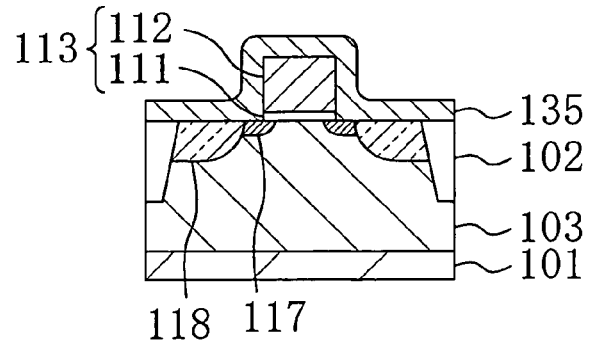
Figure 2B:
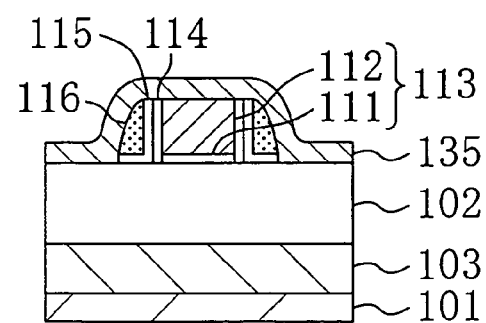

FIG. 1, FIG. 2A and FIG. 2B shows a structure of the semiconductor device according to Embodiment 1 of the present invention, wherein FIG. 1 is a plan view, FIG. 2A is a section taken along the line IIa-IIa in FIG. 1, and FIG. 2B is a section taken along the line IIb-IIb in FIG. 1.

As shown in FIG. 1, FIG. 2A and FIG. 2B, an NMIS region 103 defined by an element isolation 102 and including a p-type well is formed in a semiconductor substrate 101 made of, for example, silicon. It should be noted that in the following description of the present embodiment, the NMIS region 103 means an active region of an N-type MIS transistor formed of the semiconductor substrate 101 and surrounded by the element isolation 102. In the NMIS region 103, n-type source/drain diffusion layers 118 are formed which serves as impurity diffusion layers to which an n-type impurity ion such as arsenic is implanted. The n-type source/drain diffusion layers 118 include n-type extension diffusion layers 117 which are formed in regions below the sides of a gate portion 113 (which will be described later) and of which junction depth is comparatively shallow (see FIG. 2A).

Referring to the section taken along the line IIa-IIa in FIG. 1, on the NMIS region 103, a gate portion 113 is formed which composes the N-type MIS transistor formed of, in the upward order, a gate insulating film 111 and a gate electrode 112 (see FIG. 1 and FIG. 2A).

In contrast, referring to the section taken along the line IIb-IIb in FIG. 1, on the element isolation 102, the gate portion 113 is formed likewise, and I-shaped (platy) offset spacers 114 made of an oxide film are formed at the side faces of the gate portion 113. Further, L-shaped oxide films 115 in an L shape in section are formed at the side faces of the offset spacers 114 on the surface of the semiconductor substrate 101 in the vicinity of the offset spacers 114, and sidewalls 116 made of SiN are formed so as to cover the side faces and the bottom faces of the L-shaped oxide films 115 (see FIG. 1 and FIG. 2B). The offset spacers 114, the L-shaped oxide films 115, and the sidewalls 116 serve as sidewall insulating films.

Further, as shown in FIG. 1, FIG. 2A and FIG. 2B, a liner film 135 formed by LP-CVD and made of, for example, a nitride film having tensile stress is formed over the entirety of the semiconductor substrate 101 so as to cover the gate portion 113, the offset spacers 114, the L-shaped oxide films 115, and the sidewalls 116.

The method for manufacturing the semiconductor device according to Embodiment 1 will be described below.

FIG. 3A to FIG. 3F, FIG. 4A to FIG. 4F, and FIG. 5A to FIG. 5F are sections of the semiconductor device in respective steps in a step sequence of the semiconductor device manufacturing method according to Embodiment 1 of the present invention, wherein FIG. 3A, FIG. 3C, FIG. 3E, FIG. 4A, FIG. 4C, FIG. 4E, FIG. 5A, FIG. 5C, and FIG. 5E are sections in the step sequence corresponding to the section of FIG. 2A, and FIG. 3B, FIG. 3D, FIG. 3F, FIG. 4B, FIG. 4D, FIG. 4F, FIG. 5B, FIG. 5D, and FIG. 5F are sections in the step sequence corresponding to the section of FIG. 2B.

Figure 3A:
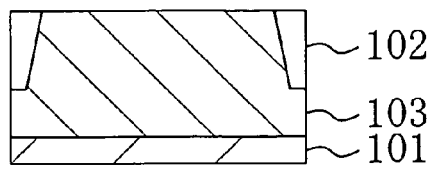
FIG. 3A to FIG. 3F are sections of the main part, each showing a semiconductor device manufacturing method according to Embodiment 1 of the present invention.
Figure 3B:
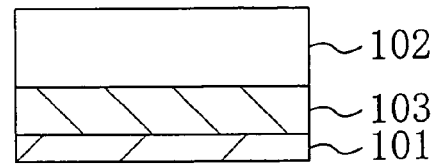

First, as shown in FIG. 3A and FIG. 3B, after the element isolation 102 formed of SIT (shallow trench isolation) is formed in the semiconductor substrate 101 by an ordinary element isolation forming method, an impurity is implanted to the semiconductor substrate 101 to form the NMIS region 103 including the p-type well.

Figure 3C:
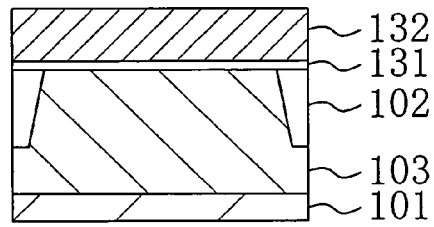
Figure 3D:
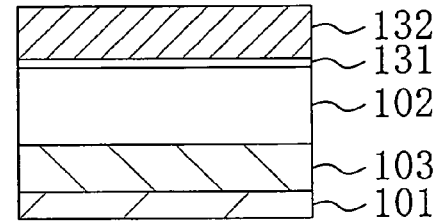

Next, as shown in FIG. 3C and FIG. 3D, an insulating film 131 is formed on the semiconductor substrate 101 by thermal oxidation or the like, and a polysilicon film 132 is formed on the insulating film 131.

Figure 3E:
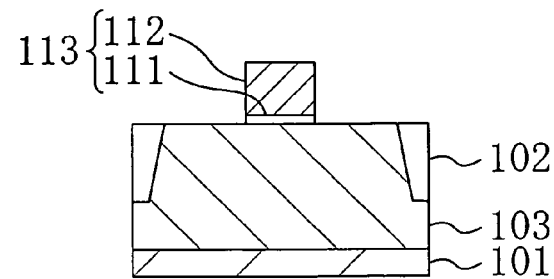
Figure 3F:
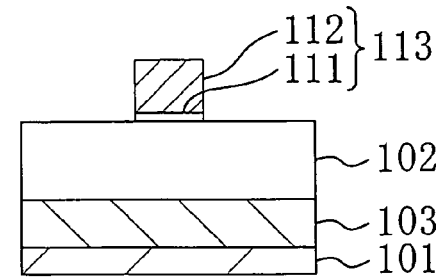

Subsequently, as shown in FIG. 3E and FIG. 3F, patterning by photolithography and dry etching is performed to form, on the NMIS region 103 and the element isolation 102, the gate portion 113 composing the N-type MIS transistor formed of the gate insulating film 111 and the gate electrode 112 so that the gate portion 113 lies astride the NMIS region 103 (see FIG. 1).

Figure 4A:
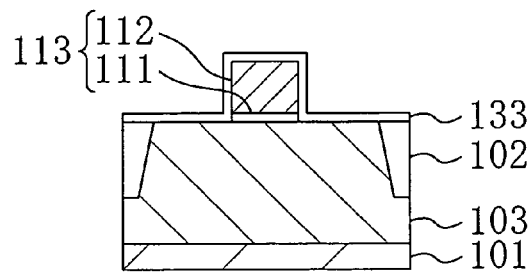
FIG. 4A to FIG. 4F are sections of the main part, each showing a semiconductor device manufacturing method according to Embodiment 1 of the present invention.
Figure 4B:
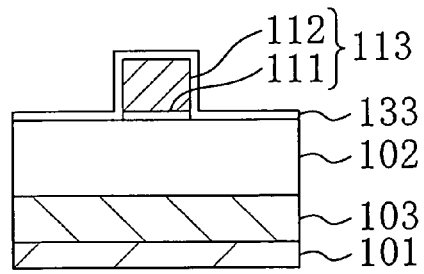

Thereafter, as shown in FIG. 4A and FIG. 4B, an oxide film 133 is formed on the entirety of the semiconductor substrate 101 by, for example, CVD (chemical vapor deposition) so as to cover the side faces and the upper face of the gate portion 113.

Figure 4C:
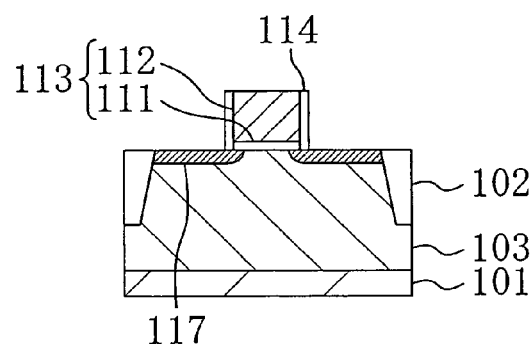
Figure 4D:
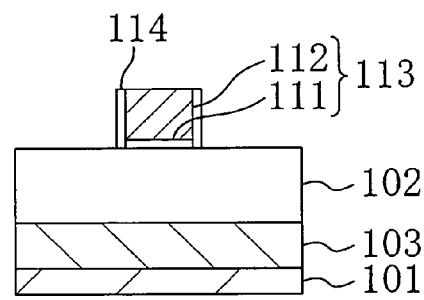

Next, as shown in FIG. 4C and FIG. 4D, the oxide film 133 is etched back to form the I-shaped offset spacers 114 made of the oxide film at the side faces of the gate portion 113 on the NMIS region 103 and the element isolation 102. Then, an n-type impurity such as arsenic is implanted into the NMIS region 103 with the use of the gate portion 113 and the I-shaped offset spacer 114 as a mask to form the n-type extension diffusion layer 117 in a region below each side of the gate portion 113 of the N-type MIS transistor.

Figure 4E:
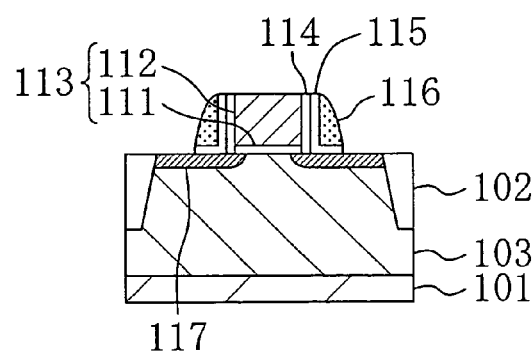
Figure 4F:
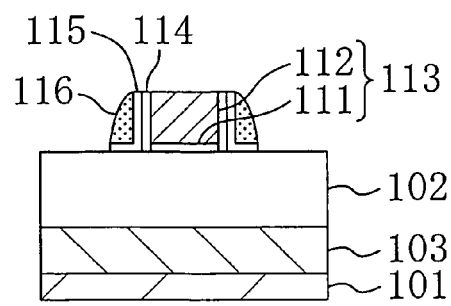

Subsequently, as shown in FIG. 4E and FIG. 4F, a silicon oxide film and a silicon nitride film are deposited in this order on the entirety of the semiconductor substrate 101.

Then, the silicon oxide film and the silicon nitride film are etched sequentially by anisotropic dry etching to form the sidewalls 116 made of the silicon nitride film at the side faces of the gate portion 113 with the L-shaped oxide films 115 interposed.

Figure 5A:
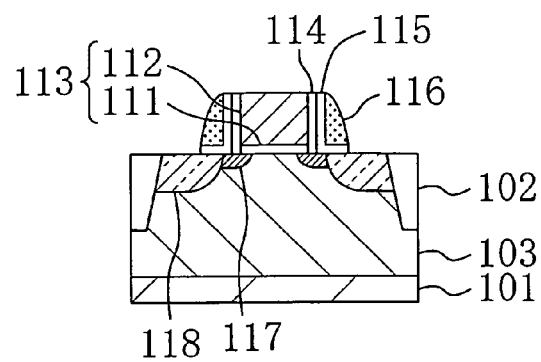
FIG. 5A to FIG. 5F are sections of the main part, each showing a semiconductor device manufacturing method according to Embodiment 1 of the present invention.
Figure 5B:
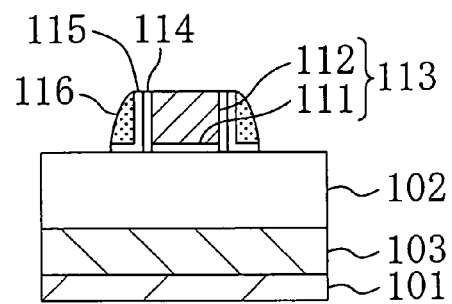

Thereafter, as shown in FIG. 5A and FIG. 5B, an n-type impurity is implanted into the NMIS region 103 with the use of the offset spacers 114, the L-shaped oxide films 115, and the sidewalls 116 as an implantation mask. Then, thermal treatment is performed for activating the impurity to form the n-type source/drain diffusion regions 118.

Figure 5C:
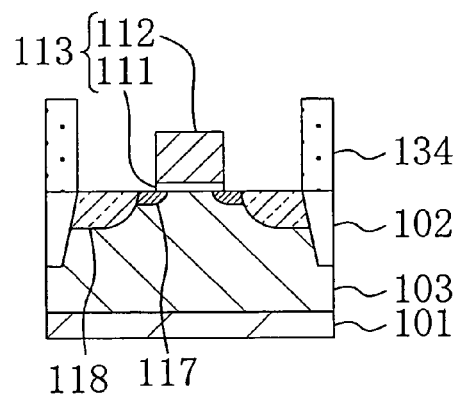
Figure 5D:
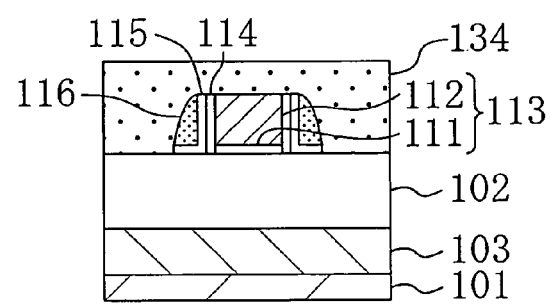

Next, as shown in FIG. 5C and FIG. 5D, a resist pattern 134 open only at a part corresponding to the NMIS region 103 is formed on the element isolation 102. Then, isotropic etching is performed using an aqueous solution containing phosphoric acid with the use of the resist pattern 134 as a mask to remove the sidewalls 116 in the NMIS region 103. Then, isotropic etching is performed using an aqueous solution containing fluoboric acid with the use of the resist pattern 134 as a mask to remove the offset spacers 114 and the L-shaped oxide films 115 in the NMIS region 103. Then, the resist pattern 134 is removed.

Figure 5E:
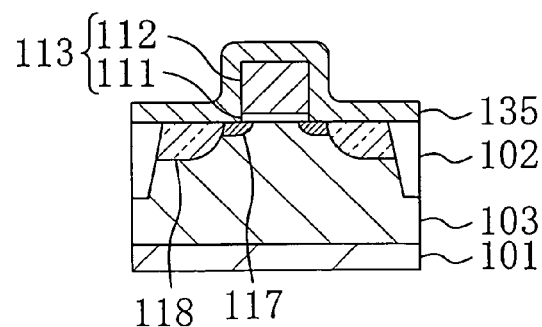
Figure 5F:
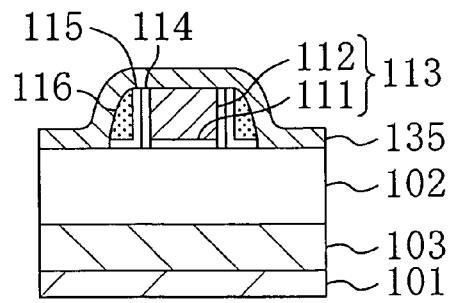

Subsequently, as shown in FIG. 5E and FIG. 5F, the liner film 135 made of, for example, a nitride film is deposited on the entirety of the semiconductor substrate 1 by LP-CVD so as to cover the gate portion 113, the offset spacers 114, the L-shaped oxide films 115, and the sidewalls 116. A nitride film is employed as the liner film 135 herein. Wherein, the liner film 135 preferably has an internal stress of 1.5 GPa or larger when it becomes at room temperature after deposition.

It is further preferable that the liner film 135 is deposited in an atmosphere of a gas having a high hydrogen rate by LP-CVD and the hydrogen composition rate in the film is reduced by performing thermal treatment in the temperature range between 400° C. and 500° C. after film formation. This increases the denseness of the liner film 135, so that the liner film 135 contracts at room temperature to exert large tensile stress.

In the semiconductor device and the method for manufacturing it according to Embodiment 1 of the present invention, the sidewall insulating films (the offset spacers 114, the L-shaped oxide films 115, and the sidewalls 116) of the gate portion 113 are removed in the NMIS region 103 including the p-type well and defined by the element isolation 102 in the semiconductor substrate 101, while the sidewall insulating films (the offset spacers 114, the L-shaped oxide films 115, and the sidewalls 116) of the gate portion 113 remain on the element isolation 102 surrounding the NMIS region 103. Accordingly, the tensile stress that the liner film 135 has is applied to the channel region of the N-type MIS transistor efficiently, increasing the tensile stress in the channel region of the N-type MIS transistor. This increases the electron mobility in the channel region of the N-type MIS transistor to increase the transistor power. The element isolation 102 is covered with the resist pattern 134 when the sidewall insulating films in the NMIS region 103 are removed, thereby preventing etching damage to the element isolation 102. When the element isolation 102 is damaged by etching, the NMIS region 103 is exposed to the air to form an interface state. However, the prevention of the etching damage suppresses formation of the interface state, preventing degradation of the transistor performance.

It is noted that the offset spacers 114 are formed at the side faces of the gate portion 113 in the present embodiment but may not be necessarily formed. Further, the silicon nitride film is employed as the sidewalls 116 herein but another film is employable, such as a silicon oxide film, a PSG film, a BPSG film, a plasma oxide film, or a silicon oxynitride film. For example, when the sidewalls 116 are made of a silicon oxide film, the L-shaped oxide films 115 may not be formed.

In addition, all of the sidewall insulating films (the offset spacers 114, the L-shaped oxide films 115, and the sidewalls 116) formed at the side faces of the gate portion 113 in the NMIS region 103 are removed in the present embodiment, but only the sidewalls 116 may be removed of the sidewall insulating films formed at the side faces of the gate portion 113 in the NMIS region 103 for the purpose of obtaining the same effects as those in Embodiment 3, which will be described later.

Embodiment 2

A semiconductor device and a method for manufacturing it according to Embodiment 2 of the present invention will be described below with reference to the drawings.

In the semiconductor device and the method for manufacturing it according to Embodiment 2 of the present invention, where an NMIS region and a PMIS region are formed on the same semiconductor substrate, a constitution and a method for obtaining it are provided in which the electron mobility is increased in the channel region of the N-type MIS transistor while the hole mobility is decreased in the channel region of the P-type MIS transistor.

The semiconductor device according to Embodiment 2 of the present invention will be described below.

Figure 6:
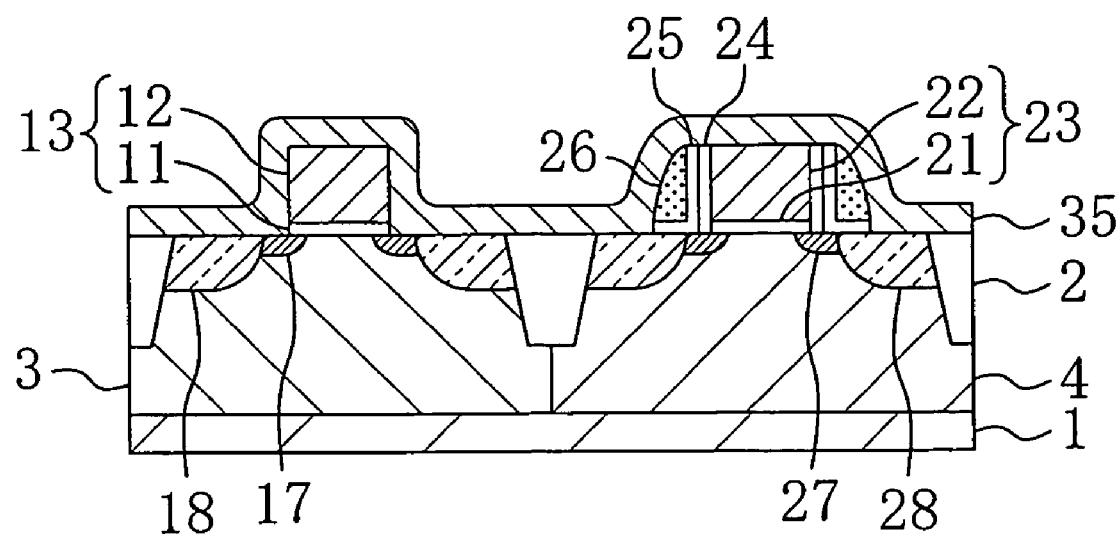
FIG. 6 is a section showing a main part of a semiconductor device according to Embodiment 2 of the present invention.

FIG. 6 shows a sectional structure of the semiconductor device according to Embodiment 2 of the present invention.

As shown in FIG. 6, an NMIS region 3 including a p-type well and a PMIS region 4 including an n-type well are formed in a semiconductor substrate made of, for example, silicon so as to be isolated from each other by an element isolation 2. It should be noted that in the following description of the present embodiment, the NMIS region 3 and the PMIS region 4 mean an active region of an N-type MIS transistor and an active region of a P-type MIS transistor, respectively, which are formed in the semiconductor substrate 1 and are surrounded by the element isolation 2. On the NMIS region 3, a gate portion 13 is formed which composes the N-type MIS transistor formed of, in the upward order, a gate insulating film 11 and a gate electrode 12. On the PMIS region 4, a gate portion 23 is formed which composes the N-type MIS transistor formed of, in the upward order, a gate insulating film 21 and a gate electrode 22.

In the NMIS region 3, n-type source/drain diffusion regions 18 are formed which serve as impurity diffusion layers to which an n-type impurity ion such as arsenic is implanted. The n-type source/drain diffusion regions 18 have n-type extension diffusion layers 17 which are formed in regions below the side faces of the gate portion 13 and of which junction depth is comparatively shallow. As well, in the PMIS region 4, p-type source/drain diffusion regions 28 are formed to which a p-type impurity such as boron is implanted and which have p-type extension diffusion layers 27.

I-shaped (platy) offset spacers 24 made of an oxide film are formed at the side faces of the gate portion 23 composing the P-type MIS transistor. L-shaped oxide films 25 are formed at the side faces of the offset spacers 24 on the surface of the semiconductor substrate 1 in the vicinity of the offset spacers 24, and sidewalls 26 made of a silicon nitride film are formed so as to cover the side faces and the bottom faces of the L-shaped oxide films 25.

Over the entirety of the semiconductor substrate 1, a liner film 35 formed by LP-CVD and made of, for example, a nitride film having tensile stress is formed so as to cover the gate portion 13 in the NMIS region 3 and the gate portion 23, the offset spacers 24, the L-shaped oxide films 25, and the sidewalls 26 in the PMIS region 4.

The method for manufacturing the semiconductor device according to Embodiment 2 will be described below.

FIG. 7A to FIG. 7D, FIG. 8A to FIG. 8D, and FIG. 9A to FIG. 9B are sections of the semiconductor device in respective steps in a step sequence of the semiconductor device manufacturing method according to Embodiment 2 of the present invention.

Figure 7A:
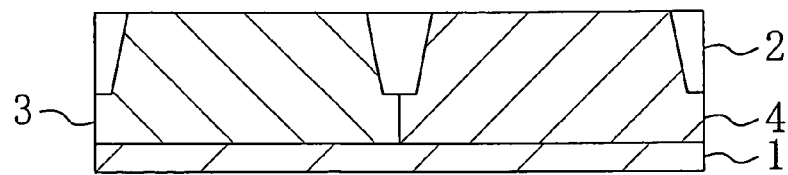
FIG. 7A to FIG. 7D are sections of the main part, each showing a semiconductor device manufacturing method according to Embodiment 2 of the present invention.

First, as shown in FIG. 7A, after the element isolation 2 formed of SIT is formed in the semiconductor substrate 1 by an ordinary element isolation forming method, an impurities are implanted to the semiconductor substrate 1 to form the NMIS region 3 including the p-type well and the PMIS region 4 including the n-type well in different steps.

Figure 7B:
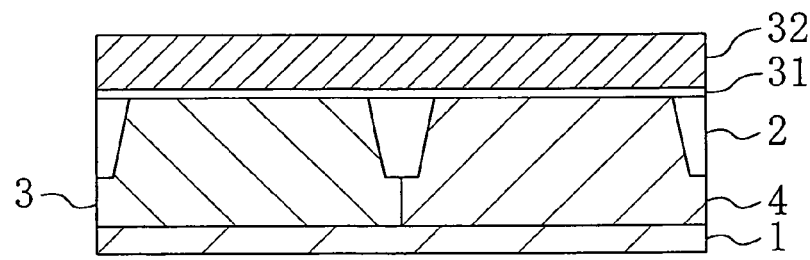

Next, as shown in FIG. 7B, an insulating film 31 is formed on the semiconductor substrate 1 by thermal oxidation or the like, and a polysilicon film 32 is formed on the insulating film 31.

Figure 7C:
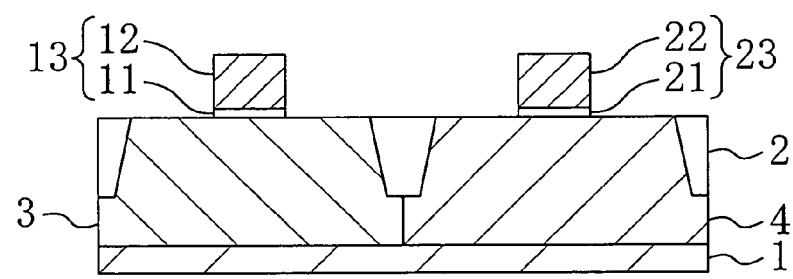

Subsequently, as shown in FIG. 7C, patterning by photolithography and dry etching is performed to form the gate portion 13 composing the N-type MIS transistor formed of the gate insulating film 11 and the gate electrode 12 on the NMIS region 3 and the gate portion 23 composing the P-type MIS transistor formed of the gate insulating film 21 and the gate electrode 22 in the PMIS region 4.

Figure 7D:
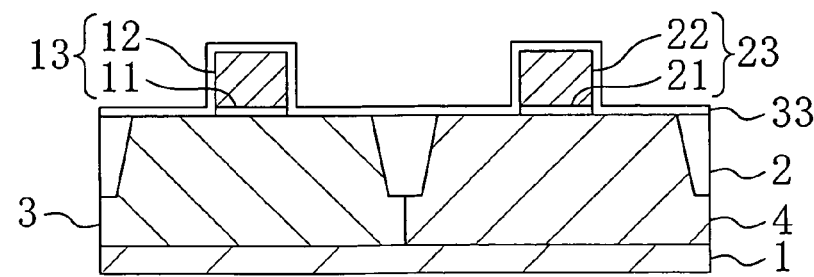

Thereafter, as shown in FIG. 7D, an oxide film 33 is formed on the entirety of the semiconductor substrate 1 by for example, CVD so as to cover the side faces and the upper faces of the gate portion 13 and the gate portion 23.

Figure 8A:
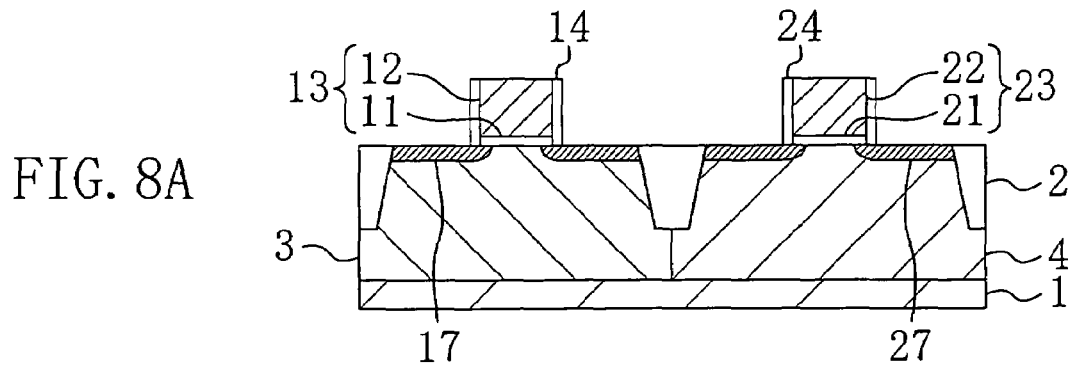
FIG. 8A to FIG. 8D are sections of the main part, each showing a semiconductor device manufacturing method according to Embodiment 2 of the present invention.

Next, as shown in FIG. 8A, the oxide film 33 is etched back to form the offset spacers 14 in an I-shape in section at the side faces of the gate portion 13 in the NMIS region 3 and the offset spacers 24 in an I shape in section at the side faces of the gate portion 23 in the PMIS region 4. Then, an n-type impurity such as arsenic is implanted into the NMIS region 3 with the use of the gate electrode 12 and the offset spacers 14 as a mask together with a resist mask (not shown) open at a part corresponding to the NMIS region 3 to form the n-type extension diffusion layer 17 in a region below each side of the gate portion 13 of the N-type MIS transistor. As well, a p-type impurity such as boron is implanted into the PMIS region 4 with the use of the gate electrode 22 and the offset spacers 24 as a mask together with a resist mask (not shown) open at a part corresponding to the PMIS region 4 to form the p-type extension diffusion layer 27 in a region below each side of the gate portion 13 of the P-type MIS transistor.

Figure 8B:
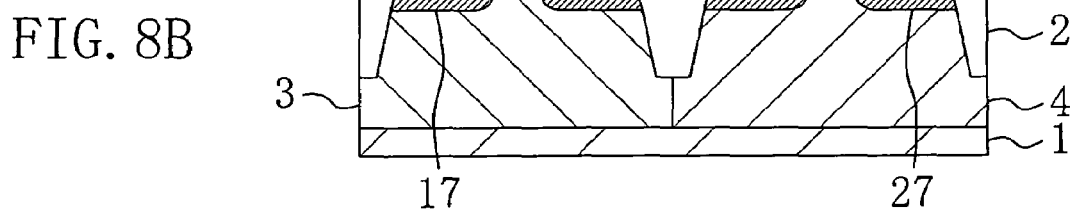

Subsequently, as shown in FIG. 8B, a silicon oxide film and a silicon nitride film, for example, are deposited in this order on the entirety of the semiconductor substrate 1.

Then, the silicon oxide film and the silicon nitride film are etched sequentially by anisotropic dry etching to form the sidewalls 16 made of the silicon nitride film at the side faces of the gate portion 13 with the L-shaped oxide films 15 interposed and to form the sidewalls 26 made of the silicon nitride film at the side faces of the gate portion 26 with the L-shaped oxide films 25 interposed.

Figure 8C:
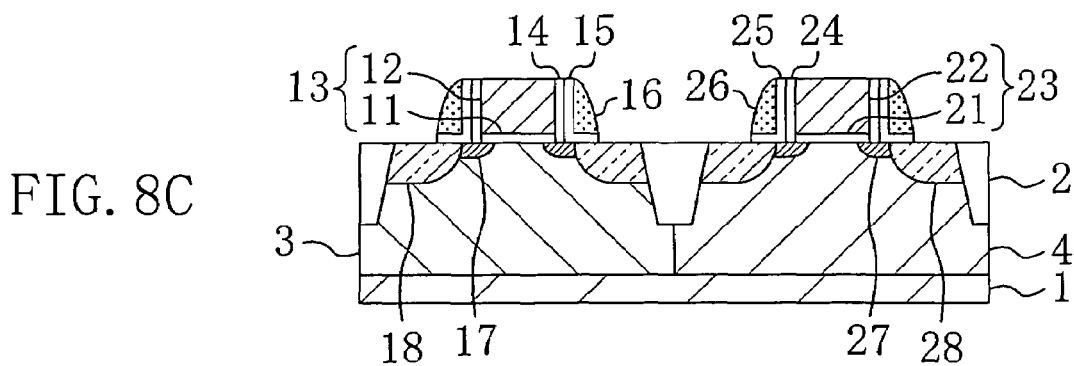

Thereafter, as shown in FIG. 8C, an n-type impurity is implanted selectively into the NMIS region 3 with the use of the offset spacers 14, the L-shaped oxide films 15, and the sidewalls 16 as an implantation mask. As well, a p-type impurity is implanted selectively into the PMIS region 4 with the use of the offset spacers 24, the L-shaped oxide films 25, and the sidewalls 26 as an implantation mask. Then, thermal treatment is performed for activating the impurities to form the n-type source/drain diffusion regions 18 and the p-type source/drain diffusion regions 28.

Figure 8D:
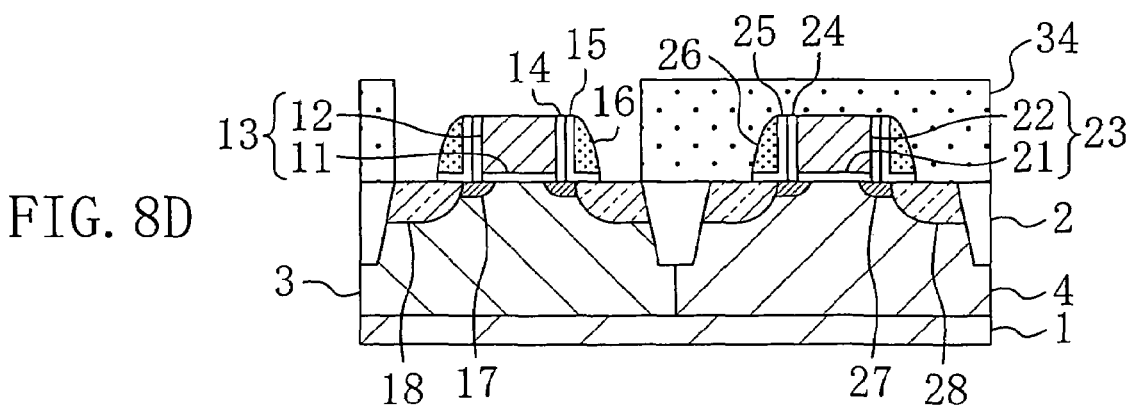

Next, as shown in FIG. 8D, a resist pattern 34 open only at a part corresponding to the NMIS region 3 is formed on the element isolation 2 and the PMIS region 4. Herein, the resist pattern 34 is formed on the element isolation 2 for preventing the element isolation 2 from being damaged by etching, which will be described later.

Figure 9A:
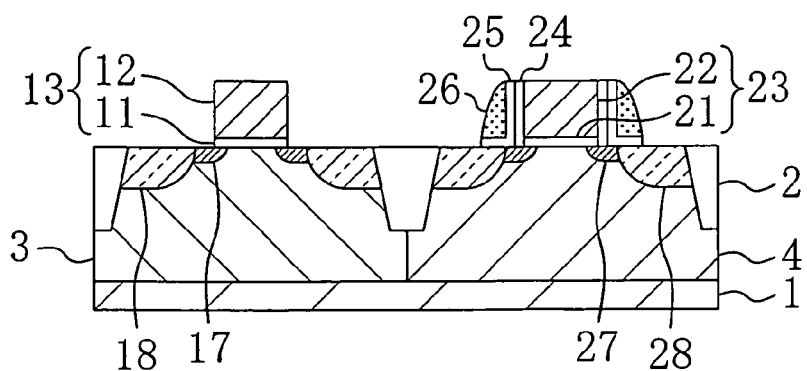
FIG. 9A and FIG. 9B are sections of the main part, each showing a semiconductor device manufacturing method according to Embodiment 2 of the present invention.

Thereafter, as shown in FIG. 9A, isotropic etching is performed using an aqueous solution containing phosphoric acid with the use of the resist pattern 34 as a mask to remove the sidewalls 16 in the NMIS region 3. Then, isotropic etching is performed using an aqueous solution containing fluoboric acid with the use of the resist pattern 34 as a mask to remove the L-shaped oxide film 15 and the offset spacers 14 in the NMIS region 3. Then, the resist pattern 34 is removed. The element isolation 2 is covered with the resist pattern 34 when the L-shaped oxide films 15 and the offset spacers 14 is removed, preventing the element isolation 2 from being damaged.

Figure 9B:
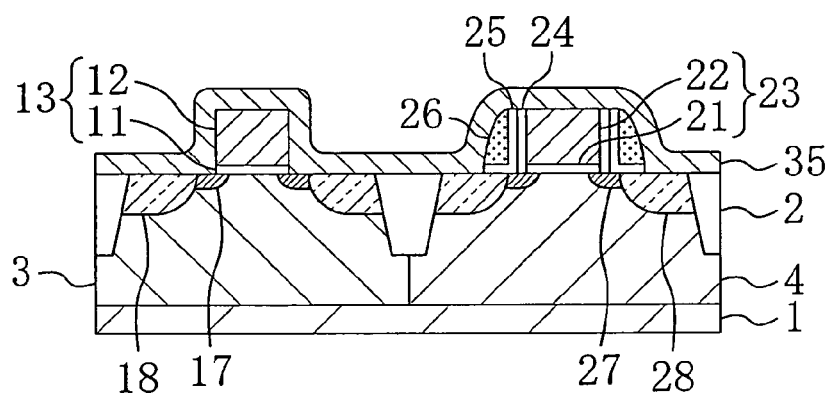

Subsequently, as shown in FIG. 9B, the liner film 35 made of, for example, a nitride film is deposited on the entirety of the semiconductor substrate 1 by LP-CVD so as to cover the gate portion 13 in the NMIS region 3 and the gate portion 23, the offset spacers 24, the L-shaped oxide films 25, and the sidewalls 26 in the PMIS region 4. A nitride film is employed as the liner film 35 herein. Wherein the liner film 35 preferably has an internal stress of 1.5 GPa or larger when it becomes at room temperature after deposition.

It is further preferable that the liner film 35 is deposited in an atmosphere of a gas having a high hydrogen rate by LP-CVD and the hydrogen composition rate in the film is reduced by performing thermal treatment in the temperature range between 400° C. and 500° C. after film formation. This increases the denseness of the liner film 35, so that the liner film 35 contracts at room temperature to exert large tensile stress.

In the semiconductor device and the method for manufacturing it according to Embodiment 2 of the present invention, where the NMIS region 3 and the PMIS region 4 are formed on the same semiconductor substrate 1, the sidewall insulating films (the offset spacers 14, the L-shaped oxide films 15, and the sidewalls 16) at the side faces of the gate portion 13 of the N-type MIS transistor are removed in the NMIS region 3. Accordingly, the tensile stress that the liner film 35 has is applied efficiently to the channel region of the N-type MIS transistor, increasing the tensile stress in the channel region of the N-type MIS transistor. This increases the electron mobility in the channel region of the N-type MIS transistor to increase the transistor power. On the other hand, in the PMIS region 4, which has no need to increase the drivability, there remain the offset spacers 24, the L-shaped oxide films 25, and the sidewalls 26 at the side faces of the gate portion 23 of the P-type MIS transistor, with no increase in tensile stress in the channel region of the P-type MIS transistor.

Specifically, consider the case where the gate length of the transistors is 50 nm and the tensile stress of the liner film is approximately 1.7 GPa. In the channel region with the sidewall insulating films formed (the PMIS region 4 in the present embodiment), the tensile stress is approximately 170 MPa and the electron mobility increases approximately 2.5% while the hole mobility decreases approximately 5%. In the channel region with no sidewall insulating films formed (the NMIS region 3 in the present embodiment), the tensile stress is approximately 600 MPa (which is approximately four times that in the case with the sidewall insulating films), and the electron mobility increases approximately 10% while the hole mobility decreases approximately 20%.

It is noted that the offset spacers 24 are formed at the side faces of the gate portion 23 in the present embodiment, but the offset spacers 24 may not be necessarily formed. Also, the silicon nitride film is employed as the sidewalls 26 herein but another film is employable such as a silicon oxide film, a PSG film, a BPSG film, a plasma oxide film, or a silicon oxynitride film. For example, when the sidewalls are made of a silicon oxide film, the L-shaped oxide films 25 may not be formed.

Embodiment 3

A semiconductor device and a method for manufacturing it according to Embodiment 3 of the present invention will be described below with reference to the drawings.

In the semiconductor device and the method for manufacturing it according to Embodiment 3 of the present invention, where an NMIS region and a PMIS region are formed on the same semiconductor substrate, a constitution and a method for obtaining it are provided in which the electron mobility is increased in the channel region of the N-type MIS transistor while the hole mobility is decreased in the channel region of the P-MIS transistor. Whereby, a semiconductor having high transistor power (drivability) is realized.

The semiconductor device according to Embodiment 3 of the present invention will be described below.

Figure 10:
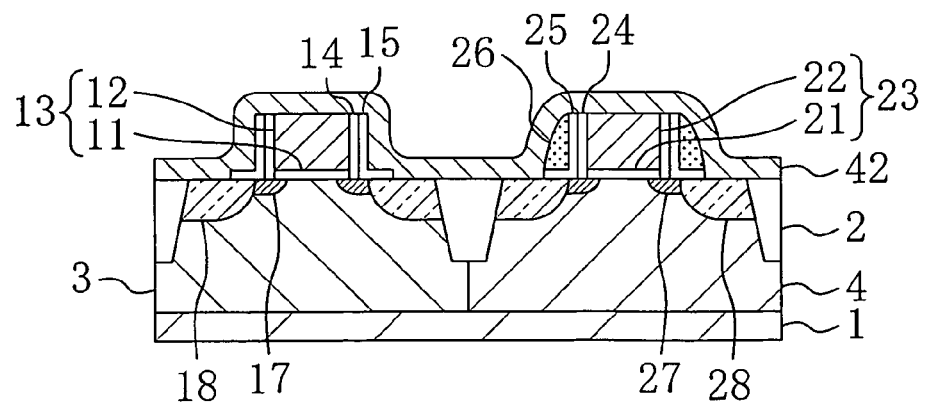
FIG. 10 is a section showing a main part of a semiconductor device according to Embodiment 3 of the present invention.

FIG. 10 shows a sectional structure of the semiconductor device according to Embodiment 3 of the present invention.

The semiconductor device shown in FIG. 10 is different from the semiconductor device according to Embodiment 2 in a point that sidewall insulating films are provided at the side faces of the gate portion 13 in the NMIS region 3, and the other aspects thereof are the same as those in Embodiment 2. Specifically, the I-shaped spacers 14 made of an oxide film are formed at the side faces of the gate portion 13 of the NMIS region 3 and the L-shaped oxide films 15 are formed at the side faces of the offset spacers 14 on the surface of the semiconductor substrate 1 in the vicinity of the offset spacers 14, which is the difference from the NMIS region 3 of the semiconductor device according to Embodiment 2.

Further, a liner film 42 formed by LP-CVD and made of, for example, a nitride film having tensile stress is formed on the entirety of the semiconductor substrate 1 so as to cover the gate portion 13, the offset spacers 14, and the L-shaped oxide films 15 in the NMIS region 3 and the gate portion 23, the offset spacers 24, the L-shaped oxide films 25, and the sidewalls 26 in the PMIS region 4.

The method for manufacturing the semiconductor device according to Embodiment 3 will be described below.

Figure 11A:
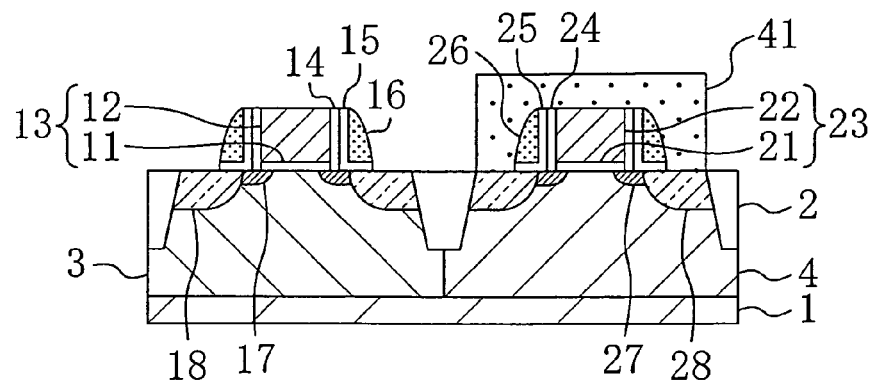
FIG. 11A to FIG. 11C are sections of the main part, each showing a semiconductor device manufacturing method according to Embodiment 3 of the present invention.
Figure 11B:
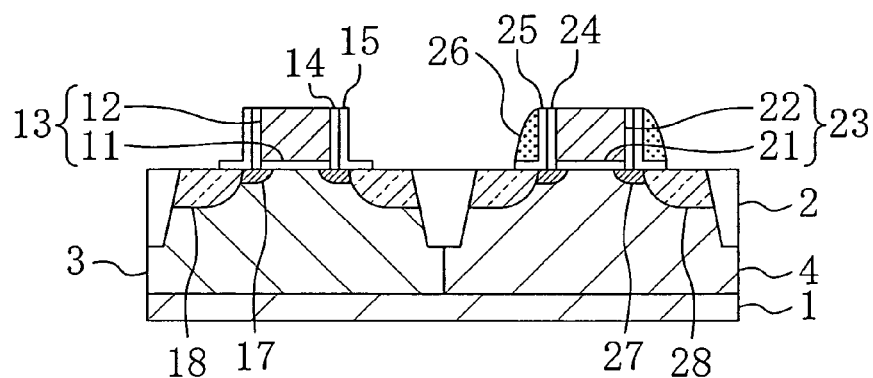
Figure 11C:
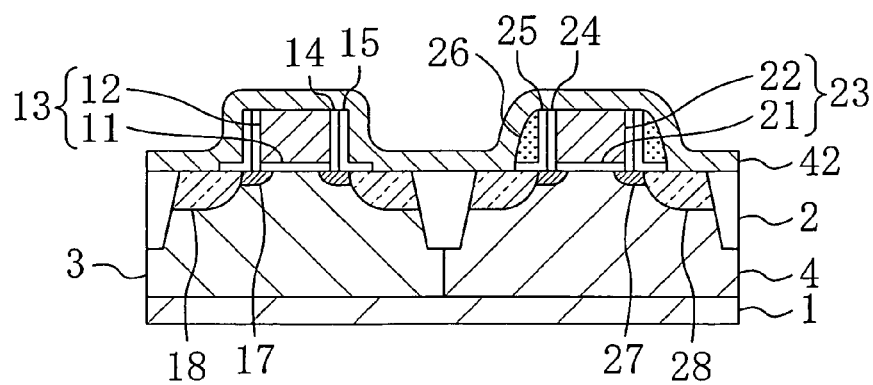
Figure 12:
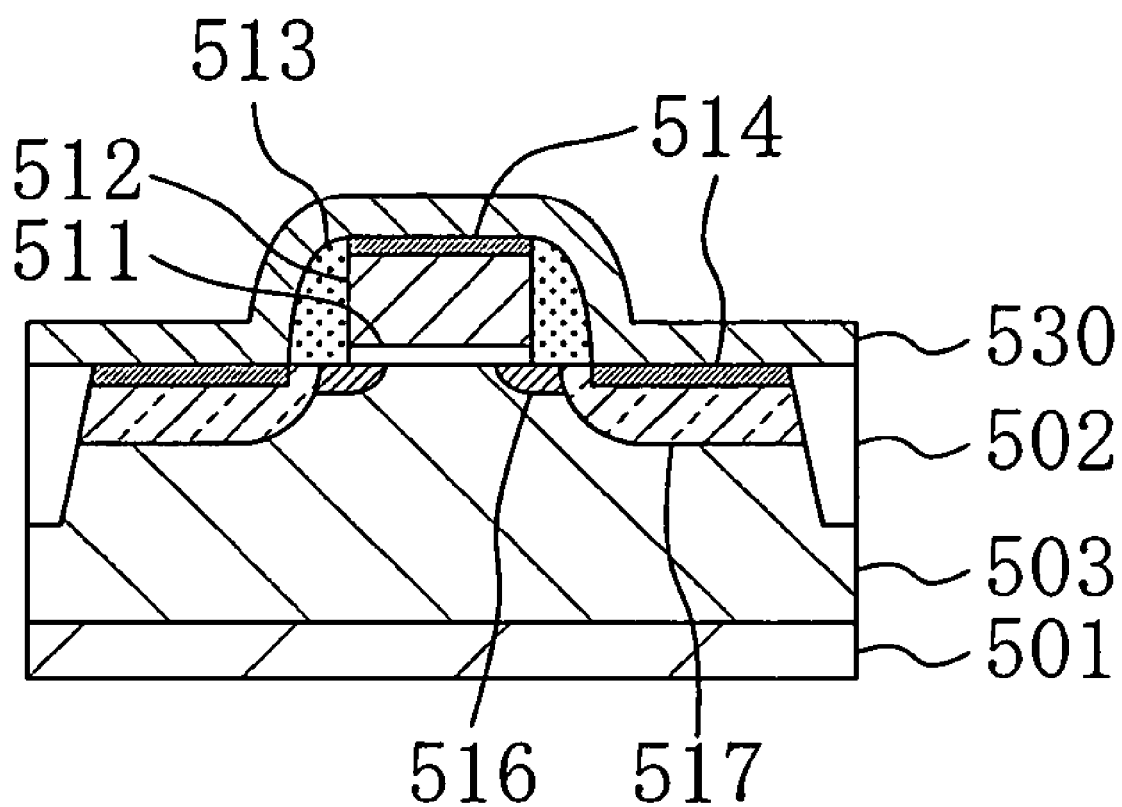
FIG. 12 is a section showing a main part of a conventional semiconductor device.

FIG. 11A to FIG. 11C are sections of the semiconductor device in respective steps in a step sequence of the semiconductor device manufacturing method according to Embodiment 3 of the present invention. Of the steps in the semiconductor device manufacturing method according to Embodiment 3 of the present invention, description of the common steps to those of the semiconductor device manufacturing method according to Embodiment 2 are omitted, and the different features are described mainly.

First, the aforementioned steps shown in FIG. 7A to FIG. 7D and FIG. 8A to FIG. 8C are performed likewise.

Next, as shown in FIG. 11A, a resist pattern 41 is formed on the PMIS region 4 except on the element isolation 2. Herein, the resist pattern 41 is not formed on the element isolation 2, which is different from the resist pattern 34 in Embodiment 3, because the element isolation 2 is free from damage by etching, which will be described later. However, it is needless to say that the resist pattern 41 may be formed also on the element isolation 2 similarly to the aforementioned resist pattern 34.

Subsequently, as shown in FIG. 11B, isotropic etching is performed using an aqueous solution containing phosphoric acid with the use of the resist pattern 41 as a mask to remove the sidewalls 16 in the NMIS region 3. Then, the resist pattern 41 is removed. It is noted that removal of the sidewall 16 with the use of the aqueous solution containing phosphoric acid causes no damage to the element isolation 2.

Thereafter, as shown in FIG. 11C, the liner film 42 made of, for example, a nitride film having tensile stress is deposited on the entirety of the semiconductor substrate 1 by LP-CVD so as to cover the gate portion 13, the offset spacers 14, and the L-shaped oxide films 15 in the NMIS region 3 and the gate portion 23, the offset spacers 24, the L-shaped oxide films 25, and the sidewalls 26 in the PMIS region 4. Similarly to that in Embodiment 1, the liner film 42 preferably has an internal stress of 1.5 GPa or larger when it becomes at room temperature after deposition. It is also preferable that the liner film 42 is deposited in an atmosphere of a gas having a high hydrogen rate by LP-CVD and the hydrogen composition rate in the film is reduced by performing thermal treatment in the temperature range between 400° C. and 500° C. after film formation.

In the semiconductor device and the method for manufacturing it according to Embodiment 3 of the present invention, where the NMIS region 3 and the PMIS region 4 are formed in the same semiconductor substrate, only the offset spacers 14 and the L-shaped oxide films 15 are formed at the side faces of the gate portion 13 in the N-type MIS transistor with the sidewalls 16 removed. Partial removal of the sidewall insulating films at the side faces of the gate portion 13 in the N-type MIS transistor leads to efficient application of the tensile stress that the liner film 42 has to the channel region of the N-type MIS transistor, though it is less applied than in Embodiment 2, the ground of which will be described later. Accordingly, the tensile stress is increased in the channel region of the N-type MIS transistor to increase the electron mobility in the channel region of the N-type MIS transistor, resulting in an increase in transistor power. Also, the offset spacers 14 and the L-shaped oxide films 15 remain at the side faces of the gate portion 13 of the N-type MIS transistor, which is the difference from that in Embodiment 2. Accordingly, damage by etching to the surface of the semiconductor substrate 1 is reduced, and a region where the liner film 42 is in direct contact with the semiconductor substrate 1 is reduced, thereby suppressing formation of an interface state which would involve an adverse influence on the characteristic of the transistors. On the other hand, in the PMIS region 4, which has no need to increase the drivability, the offset spacers 24, the L-shaped oxide films 25, and the sidewalls 36 remain at the side faces of the gate portion 23 of the P-type MIS transistor, resulting in no increase in tensile stress in the channel region of the P-type MIS transistor.

Specifically, consider the case where the gate length of the transistors is 50 nm and the internal stress of the liner film is approximately 1.7 GPa. In the channel region with the sidewall insulating films formed (the PMIS region 4 in the present embodiment), the tensile stress is approximately 170 MPa and the electron mobility increases approximately 2.5% while the hole mobility decreases approximately 5%. In the channel region with a part of the sidewall insulating films removed (the NMIS region 3 where the sidewalls 16 are removed in the present embodiment), the tensile stress is approximately 250 MPa and the electron mobility increases approximately 4% while the hole mobility decreases approximately 7.5%.

It is noted that the gate portion 13 formed on the NMIS region 3 in Embodiments 2 and 3 may be formed on also the element isolation 2 so as to lie astride the NMIS region 3 as in Embodiment 1. In this case, the sidewall insulating films at the NMIS region 3 may be removed without removing the sidewall insulating films on the element isolation 2 as in Embodiments 2 and 3.

In addition, the carrier mobility changes depending on the type of the carriers and a direction of carrier conduction, and therefore, may be designed appropriately according to the channel direction to be set.

The present invention is useful for a method for manufacturing a semiconductor device having high transistor power.

What is claimed is:

1. A semiconductor device, comprising:
    a semiconductor substrate;
    an element isolation;
    a first MIS transistor on the semiconductor substrate; and
    an insulating film which has tensile stress and which is formed on the semiconductor substrate so as to cover the first MIS transistor,
    wherein the first MIS transistor includes:
        a p-type semiconductor layer defined by the element isolation in the semiconductor substrate;

a first gate insulating film formed on the p-type semiconductor layer;

a first gate electrode formed on the first gate insulating film, the first gate electrode having a first portion disposed on the p-type semiconductor layer and a second portion disposed on the element isolation so as to lie astride the p-type semiconductor layer;

a first sidewall insulating film formed at each side face of the second portion of the first gate electrode on the element isolation and including at least a first sidewall;

an n-type extension diffusion layer formed outwards from the first portion of the first gate electrode in the p-type semiconductor layer; and an n-type impurity diffusion layer formed in a region of the p-type semiconductor layer which is adjacent to the n-type extension diffusion layer, wherein the first sidewall insulating film is not formed at each side face of the first portion of the first gate electrode on the p-type semiconductor layer.

2. The semiconductor device of claim 1, further comprising a second MIS transistor, wherein the second MIS transistor includes:

an n-type semiconductor layer defined by the element isolation in the semiconductor substrate;

a second gate insulating film formed on the n-type semiconductor layer;

a second gate electrode formed on the second gate insulating film;

a second sidewall insulating film formed at each side face of the second gate electrode and including at least a second sidewall;

a p-type extension diffusion layer formed outwards from the second gate electrode in the n-type semiconductor layer; and a p-type impurity diffusion layer formed in a region of the n-type semiconductor layer which is adjacent to the p-type extension diffusion layer, and the insulating film having tensile stress further covers the second MIS transistor.

3. The semiconductor device of claim 1, wherein the first sidewall insulating film further includes an L-shaped insulating film in an L shape in section disposed between the first sidewall and the each side face of the second portion of the first gate electrode and between the first sidewall and the element isolation, and a third sidewall insulating film made of the L-shaped insulating film disposed on the each side face of the first portion of the first gate electrode on the p-type semiconductor layer.

4. The semiconductor device of claim 1, wherein the insulating film having tensile stress is formed so as to be in contact with a side surface of the first portion of the first gate electrode.

5. The semiconductor device of claim 1, wherein the first sidewall is made of a silicon nitride film.

6. The semiconductor device of claim 1, wherein the insulating film having tensile stress is made of a silicon nitride film.

7. The semiconductor device of claim 1, wherein the channel direction in the first MIS transistor is set along a crystal orientation of <110> in the semiconductor substrate.

8. The semiconductor device of claim 3, wherein the L-shaped insulating film includes:

a first insulating film in an I shape in section disposed on the each side face of the first gate electrode; and a second insulating film in an L shape in section disposed on a side face of the first insulating film.

9. The semiconductor device of claim 3, wherein the insulating film having tensile stress is formed so as to be in contact with a L-shaped surface of the third sidewall insulating film.

10. The semiconductor device of claim 3, wherein the first sidewall is made of a silicon nitride film, and the L-shaped insulating film is made of an oxide film.

11. A semiconductor device, comprising:

a semiconductor substrate;

an element isolation;

a first MIS transistor and a second MIS transistor, the first MIS transistor and the second MIS transistor being formed in the semiconductor substrate; and an insulating film having tensile stress which is formed on the semiconductor substrate so as to cover the first MIS transistor and the second MIS transistor, wherein the first MIS transistor includes:

a p-type semiconductor layer defined by the element isolation in the semiconductor substrate;

a first gate insulating film formed on the p-type semiconductor layer;

a first gate electrode formed on the first gate insulating film;

an n-type extension diffusion layer formed outwards from the first gate electrode in the p-type semiconductor layer; and an n-type impurity diffusion layer formed in a region of the p-type semiconductor layer which is adjacent to the n-type extension diffusion layer, the second MIS transistor includes:

an n-type semiconductor layer defined by the element isolation in the semiconductor substrate;

a gate insulating film formed on the n-type semiconductor layer;

a second gate electrode formed on the second gate insulating film;

a first sidewall insulating film formed at each side face of the second gate electrode and including at least a first sidewall;

a p-type extension diffusion layer formed outwards from the second gate electrode in the n-type semiconductor layer; and a p-type impurity diffusion layer formed in a region of the n-type semiconductor layer which is adjacent to the n-type extension diffusion layer, and the first sidewall insulating film includes an L-shaped insulating film in an L shape in section disposed between the first sidewall and each side face of the second gate electrode and between the first sidewall and the n-type semiconductor layer, and the first sidewall is not formed at each side of the first gate electrode and a second sidewall insulating film made of the L-shaped insulating film is formed at each side face of the first gate electrode.

12. The semiconductor device of claim 11, wherein the L-shaped insulating films included in the first sidewall insulating film includes an I-shaped insulating film in an I shape in section which is formed at each side face of the first gate electrode and the second gate electrode and a second insulating film in an L shape in section which is formed at the side face of the I-shaped insulating film.

13. The semiconductor device of claim 11,
wherein the insulating film having tensile stress is formed so as to be in contact with a L-shaped surface of the second sidewall insulating film.

14. The semiconductor device of claim 11,
wherein the first sidewall is made of a silicon nitride film.

15. The semiconductor device of claim 11,
wherein the insulating film having tensile stress is made of a silicon nitride film.

* * * * *